(12) United States Patent
Ahn et al.

(10) Patent No.: US 9,257,563 B2
(45) Date of Patent: Feb. 9, 2016

(54) THIN FILM TRANSISTOR ARRAY PANEL AND METHOD OF MANUFACTURING THE SAME

(71) Applicants: Samsung Display Co., Ltd., Yongin-si, Gyeonggi-do (KR); Kookmin University Industry Academy Cooperation Foundation, Seoul (KR)

(72) Inventors: Byung Du Ahn, Hwaseong-si (KR); Jung Hwa Kim, Gunpo-si (KR); Ji Hun Lim, Goyang-si (KR); Je Hun Lee, Seoul (KR); Dae Hwan Kim, Seoul (KR); Hyun Kwang Jung, Seoul (KR)

(73) Assignees: SAMSUNG DISPLAY CO., LTD. (KR); KOOKMIN UNIVERSITY INDUSTRY ACADEMY COOPERATION FOUNDATION (KR)

(*) Notice: Subject to any disclaimer, the term of this patent is extended or adjusted under 35 U.S.C. 154(b) by 0 days.

(21) Appl. No.: 13/798,811

(22) Filed: Mar. 13, 2013

(65) Prior Publication Data
US 2014/0084293 A1   Mar. 27, 2014

(30) Foreign Application Priority Data

Sep. 21, 2012   (KR) .................. 10-2012-0105381

(51) Int. Cl.
| | |
|---|---|
| H01L 29/10 | (2006.01) |
| H01L 29/786 | (2006.01) |
| H01L 29/66 | (2006.01) |
| H01L 33/38 | (2010.01) |
| H01L 29/417 | (2006.01) |

(52) U.S. Cl.
CPC ...... *H01L 29/7869* (2013.01); *H01L 29/41733* (2013.01); *H01L 29/66969* (2013.01); *H01L 29/78693* (2013.01); *H01L 33/387* (2013.01)

(58) Field of Classification Search
None
See application file for complete search history.

(56) References Cited

U.S. PATENT DOCUMENTS

| | | | | |
|---|---|---|---|---|
| 7,034,335 | B2 * | 4/2006 | Fujikawa | H01L 27/124 257/59 |
| 8,179,491 | B2 * | 5/2012 | Park | H01L 29/78606 349/139 |

(Continued)

FOREIGN PATENT DOCUMENTS

| | | |
|---|---|---|
| JP | 2011-216694 A | 10/2011 |
| KR | 1020080050802 A | 6/2008 |

(Continued)

OTHER PUBLICATIONS

Hsiao-Wen Zan et al., "Dual gate indium-gallium-zinc-oxide thin film transistor with an unisolated floating metal gate for threshold voltage modulation and mobility enhancement", Appl. Phys. Lett. 98, 2011, pp. 153506-1-153506-3.

*Primary Examiner* — Benjamin Sandvik
*Assistant Examiner* — Herve Assouman
(74) *Attorney, Agent, or Firm* — Cantor Colburn LLP

(57) ABSTRACT

A thin film transistor array panel includes a substrate, a gate electrode on the substrate, a gate insulating layer on the gate electrode, a semiconductor layer on the gate insulating layer, a source electrode and a drain electrode on the semiconductor layer and facing each other, a floating metal layer between the source electrode and the drain electrode, and a passivation layer covering the source electrode, the drain electrode, and the floating metal layer. The floating metal layer is electrically floating.

20 Claims, 13 Drawing Sheets

(56) References Cited

U.S. PATENT DOCUMENTS

| | | |
|---|---|---|
| 2008/0014665 A1 | 1/2008 | Kim |
| 2008/0135846 A1* | 6/2008 | Shin .................. H01L 27/0248 257/59 |
| 2010/0001346 A1 | 1/2010 | Ye |
| 2010/0065842 A1 | 3/2010 | Yamazaki et al. |
| 2011/0115763 A1 | 5/2011 | Yamazaki et al. |
| 2011/0127533 A1* | 6/2011 | Chung ................ H01L 27/3258 257/59 |
| 2011/0303962 A1 | 12/2011 | Lim et al. |
| 2012/0064710 A1 | 3/2012 | Sim et al. |
| 2012/0112180 A1* | 5/2012 | Zan .................. H01L 29/78693 257/43 |

FOREIGN PATENT DOCUMENTS

| | | |
|---|---|---|
| KR | 1020100032224 A | 3/2010 |
| KR | 1020100052925 A | 5/2010 |
| KR | 1020110027472 A | 3/2011 |
| KR | 1020110056962 A | 5/2011 |
| KR | 1020110061419 A | 6/2011 |
| KR | 1020110065894 A | 6/2011 |
| KR | 1020110127861 A | 11/2011 |

* cited by examiner

THIN FILM TRANSISTOR ARRAY PANEL AND METHOD OF MANUFACTURING THE SAME

This application claims priority to Korean Patent Application No. 10-2012-0105381 filed on Sep. 21, 2012, and all the benefits accruing therefrom under 35 U.S.C. §119, the entire contents of which are incorporated herein by reference.

BACKGROUND (a) Field

The invention relates to a thin film transistor array panel and a method of manufacturing the same.

(b) Description of the Related Art

A flat panel display such as a liquid crystal display ("LCD"), an organic light emitting diode display ("OLED" display), an electrophoretic display and a plasma display includes plural pairs of field generating electrodes, and an electro-optical active layer interposed therebetween. The LCD includes a liquid crystal layer as the electro-optical active layer, and the OLED display includes an organic emission layer as the electro-optical active layer. One of the field generating electrodes in a pair is generally connected to a switching element to receive an electric signal, and the electro-optical active layer displays an image by converting the electric signal to an optical signal.

The flat panel display may include a display panel on which a thin film transistor, as a switching element, is disposed. The display panel including the thin film transistor may be referred to a thin film transistor array panel. Various layers of electrodes, semiconductors and the like are patterned on the thin film transistor array panel, and a mask is generally used in a patterning process.

The semiconductor is an important factor determining a characteristic of the thin film transistor. Amorphous silicon is frequently used as the semiconductor, but since charge mobility thereof is low, manufacturing a high performance thin film transistor may be limited. Further, where polysilicon is used as the semiconductor, a high performance thin film transistor may be more easily manuafctured because charge mobility of the polysilicon is high, but a relatively large thin film transistor array panel using the polysilicon may be difficult to manufacture because cost of the polysilicon is high and uniformity is low.

Accordingly, a thin film transistor adopting an oxide semiconductor having electron mobility that is higher than that of amorphous silicon, a high ON/OFF ratio of electrical current, a lower cost and a higher uniformity than that of polysilicon has been studied.

If a length of a channel in the thin film transistor is shortened owing to the adopted oxide semiconductor, charge mobility may be undesirably deteriorated due to an effect of a fringe field by a high drain bias. Further, in an etching process used in forming source and drain electrodes of the thin film transistor, since a surface of a back channel portion is damaged, reliability of the thin film transistor array panel employing the source and drain electrodes may be undesirably reduced. Therefore, there exists a need for an improved display panel and method of forming the same, which maintains a high charge mobility and reliability thereof.

SUMMARY

One or more exemplary embodiment of the invention provides a thin film transistor array panel reducing an effect of a fringe field around a channel portion of a thin film transistor therein, and improving charge mobility of the thin film transistor, and a method of manufacturing the same.

An exemplary embodiment of the invention provides a thin film transistor array panel including: a substrate, a gate electrode on the substrate, a gate insulating layer on the gate electrode, a semiconductor layer on the gate insulating layer, a source electrode and a drain electrode on the semiconductor layer and facing each other, a floating metal layer between the source electrode and the drain electrode, and a passivation layer covering the source electrode, the drain electrode and the floating metal layer. The floating metal layer is electrically floating.

The floating metal layer may overlap a channel portion of the semiconductor layer.

The floating metal layer may be directly on the semiconductor layer.

The floating metal layer may be in a same layer as the source electrode and the drain electrode.

The floating metal layer may be island-shaped.

An electrical current moving path in the semiconductor layer may have a "W" shape.

The thin film transistor array panel may further include an etching prevention layer between the floating metal layer and the semiconductor layer.

The source electrode and the drain electrode may overlap opposing edges of the etching prevention layer.

The semiconductor layer may include an oxide semiconductor.

The floating metal layer may be a material having a Fermi level that is higher than a Fermi level of the semiconductor layer.

Another exemplary embodiment of the invention provides a method of manufacturing a thin film transistor array panel, the method including: providing a gate electrode on a substrate; providing a gate insulating layer on the gate electrode, providing an oxide semiconductor layer on the gate insulating layer, providing a source electrode and a drain electrode facing each other, and a floating metal layer between the source electrode and the drain electrode on the oxide semiconductor layer, and providing a passivation layer covering the source electrode, the drain electrode, and the floating metal layer. The floating metal layer is electrically floating.

The floating metal layer may overlap a channel portion of the oxide semiconductor layer.

The floating metal layer may be directly on the oxide semiconductor layer.

The providing a source electrode, a drain electrode and a floating metal layer may include forming the floating metal layer during a same process as forming the source electrode and the drain electrode.

The method may further include providing an etching prevention layer between the floating metal layer and the oxide semiconductor layer.

The providing a source electrode, a drain electrode and a floating metal layer may include forming the floating metal layer during a same process as forming the source electrode and the drain electrode.

The source electrode and the drain electrode may overlap opposing edges of the etching prevention layer.

According to one or more exemplary embodiment of the invention, an effect of a fringe field is reduced and charge mobility is improved in a thin film transistor which includes an electrically floating metal layer on an upper portion of a semiconductor layer.

BRIEF DESCRIPTION OF THE DRAWINGS

The above and other features of this disclosure will become more apparent by describing in further detail, exemplary embodiment thereof with reference to the accompanying drawings, in which.

DETAILED DESCRIPTION

Figure 1:
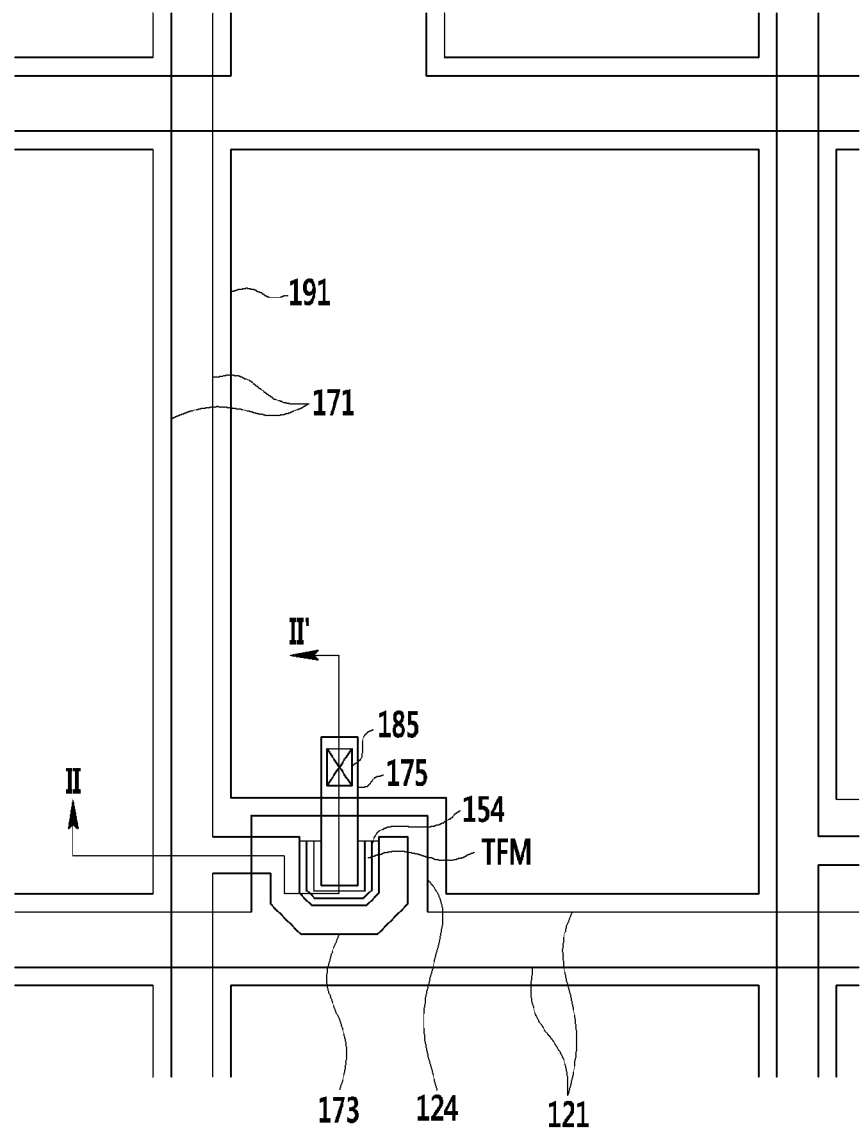
FIG. 1 is a top plan view showing an exemplary embodiment of a thin film transistor array panel according to the invention.

Hereinafter, exemplary embodiments of the invention will be described in detail with reference to the accompanying drawings. As those skilled in the art would realize, the described embodiments may be modified in various different ways, all without departing from the spirit or scope of the invention. On the contrary, exemplary embodiments introduced herein are provided to make disclosed contents thorough and complete and sufficiently transfer the spirit of the invention to those skilled in the art.

In the drawings, the thickness of layers, films, panels, regions, etc., are exaggerated for clarity. Further, it will be understood that when a layer is referred to as being "on" another layer or substrate, it can be directly on the other layer or substrate, or intervening them may also be present. As used herein, connected may refer to elements being physically and/or electrically connected to each other. Like reference numerals designate like elements throughout the specification. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "lower," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" or "beneath" relative to other elements or features would then be oriented "upper" relative to the other elements or features. Thus, the exemplary term "beneath" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be described in detail with reference to the accompanying drawings.

Figure 2:
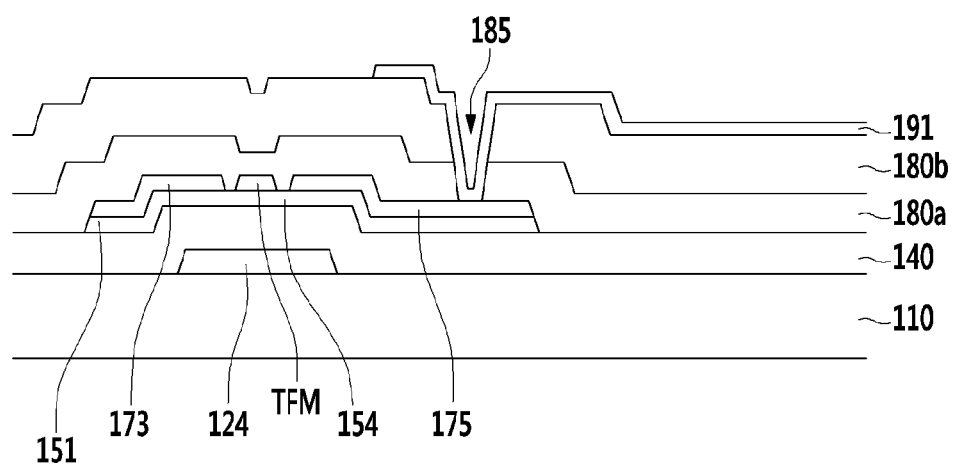
FIG. 2 is a cross-sectional view taken along line II-II of FIG. 1.

FIG. 1 is a top plan view showing an exemplary embodiment of a thin film transistor array panel according to the invention. FIG. 2 is a cross-sectional view taken along line II-II of FIG. 1.

Referring to FIG. 1 and FIG. 2, one or more gate line 121 is disposed on a substrate 110 which includes a transparent glass or plastic.

The gate line 121 transfers a gate signal and have a longitudinal axis which mainly extends in a horizontal direction in the plan view of FIG. 1. The gate line 121 includes a plurality of gate electrodes 124 protruding from the gate line 121.

The gate line 121 and the gate electrodes 124 may include at least one selected from aluminum-based metal such as aluminum (Al) and an aluminum alloy, silver-based metal such as silver (Ag) and a silver alloy, and copper-based metal such as copper (Cu) and a copper alloy.

The illustrated exemplary embodiment discloses the gate line 121 and the gate electrodes 124 as a single layer structure, but the invention is not limited thereto, and the gate line 121 and the gate electrodes 124 may have a dual layer or triple layer structure.

Where the gate line 121 and the gate electrodes 124 have a dual layer structure, the gate line 121 and the gate electrodes 124 may include a lower layer and an upper layer. The lower layer may include at least one selected from molybdenum-based metal such as molybdenum (Mo) and a molybdenum alloy, chromium (Cr), a chromium alloy, titanium (Ti), a titanium alloy, tantalum (Ta), a tantalum alloy, manganese (Mn), and a manganese alloy. The upper layer may include at least one selected from aluminum-based metal such as aluminum (Al) and an aluminum alloy, silver-based metal such as silver (Ag) and a silver alloy, and copper-based metal such as copper (Cu) and a copper alloy. In the triple layer structure, the gate line 121 and the gate electrodes 124 may include a combination of layers having different physical properties.

A gate insulating layer 140 is disposed on the gate line 121. The gate insulating layer 140 may include silicon oxide or silicon nitride. The illustrated exemplary embodiment discloses the gate insulating layer 140 as a single layer structure, but the gate insulating layer 140 may have a dual layer structure.

Specifically, a plurality of layers of the gate insulating layer 140 may include a first insulating layer, and a second insulating layer positioned on the first insulating layer. The first insulating layer may include silicon nitride ($SiN_x$) in a thickness of about 4000 angstroms (Å), and the second insulating layer may include silicon oxide ($SiO_2$) in a thickness of about 500 Å. In another exemplary embodiment, the first insulating layer may include silicon oxynitride (SiON), and the second insulating layer may include silicon oxide ($SiO_2$).

One or more semiconductor layer 151 including an oxide semiconductor is disposed on the gate insulating layer 140. The semiconductor layer 151 has a longitudinal axis which mainly extends in a vertical direction in the plan view of FIG. 1, and includes a plurality of projections 154 protruded from a main portion of the semiconductor layer 151 and extending toward the gate electrode 124.

The oxide semiconductor according to the illustrated exemplary embodiment includes at least one selected from tantalum (Ta), zinc (Zn), indium (In), tin (Sn), gallium (Ga), and hafnium (Hf).

One or more of a data line 171, a source electrode 173 connected to the data line 171, and a drain electrode 175 positioned to face the source electrode 173 is disposed on the semiconductor layer 151.

The data line 171 transports a data signal and has a longitudinal axis which mainly extends in the vertical direction in the plan view of FIG. 1 to cross the gate line 121. A portion of the data line 171 continuously extends toward the gate electrode 124 to form the source electrode 173 connected to the data line and having a planar "U" shape.

The drain electrode 175 is separated from the data line 171, and extends upward in the vertical direction from a location in a middle of the U-shaped source electrode 173. The shapes of the source electrode 173 and the drain electrode 175 are an example, and may be variously modified.

In the exemplary embodiment, a floating metal layer TFM is disposed between the source electrode 173 and the drain electrode 175 which are separated from each other. The floating metal layer TFM may be spaced apart from the source electrode 173 and the drain electrode 175 at a predetermined interval, and may have a U shape similar to the shape of the source electrode 173 in the plan view of the thin film transistor array panel. The floating metal layer TFM may include a same material as the source electrode 173 and the drain electrode 175, and may be in and/or on a same layer of the thin film transistor array panel as the source and drain electrodes 173 and 175 as including the same material as the source and drain electrodes 173 and 175. A channel region is formed or defined by a portion of the projection 154 of the semiconductor layer 151 exposed by the source and drain electrodes 173 and 175, and the floating metal layer TFM may be have island shape overlapping the channel region of the semiconductor layer 154. As the island shape, the floating metal layer TFM may be a discrete and enclosed member, and may be separated from other elements such as in the plan view.

In the illustrated exemplary embodiment, the floating metal layer TFM is island-shape which is electrically isolated and electrically floated with respect to other elements of the thin film transistor array panel and/or the thin film transistor thereof. In the illustrated exemplary embodiment, the floating metal layer TFM may be positioned directly on the projection 154 of the semiconductor layer, but is not limited thereto or thereby. Further, the floating metal layer TFM may include a material having a Fermi level that is higher than a Fermi level of the semiconductor layer 151 and 154.

The illustrated exemplary embodiment discloses that the floating metal layer TFM includes the same material as the source electrode 173 and the drain electrode 175, but is not limited thereto or thereby. In another exemplary embodiment, the floating metal layer TFM, the source electrode 173 and the drain electrode 175 may include different materials such as by performing patterning processes during different operations in manufacturing the thin film transistor array panel.

A data wire layer including the data line 171, the floating metal layer TFM, the source electrode 173 and the drain electrode 175 may include at least one selected from aluminum-based metal such as aluminum (Al) and an aluminum alloy, silver-based metal such as silver (Ag) and a silver alloy, copper-based metal such as copper (Cu) and a copper alloy, molybdenum-based metal such as molybdenum (Mo) and a molybdenum alloy, chromium (Cr), a chromium alloy, titanium (Ti), a titanium alloy, tantalum (Ta), a tantalum alloy, manganese (Mn), and a manganese alloy.

The illustrated exemplary embodiment discloses the data line 171, the source electrode 173 and the drain electrode 175 as a single layer structure, but the invention is not limited thereto. In an alternative exemplary embodiment, the data line 171, the source electrode 173 and the drain electrode 175 may have a dual layer or triple layer structure.

Where the data line 171, the source electrode 173 and the drain electrode 175 have the dual layer structure, the data line 171, the source electrode 173 and the drain electrode 175 may include a lower layer and an upper layer. The lower layer may include at least one selected from molybdenum-based metal such as molybdenum (Mo) and a molybdenum alloy, chromium (Cr), a chromium alloy, titanium (Ti), a titanium alloy, tantalum (Ta), a tantalum alloy, manganese (Mn), and a manganese alloy. The upper layer may include at least one selected from aluminum-based metal such as aluminum (Al) and an aluminum alloy, silver-based metal such as silver (Ag) and a silver alloy, and copper-based metal such as copper (Cu) and a copper alloy. In the triple layer structure, the data line 171, the source electrode 173 and the drain electrode 175 may include a combination of layers having different physical properties.

An exposed portion of the projection 154 of the semiconductor layer 151 not covered (e.g., not overlapped) by the source electrode 173, the floating metal layer TFM and the drain electrode 175 are between the source electrode 173 and the floating metal layer TFM, and between the drain electrode 175 and the floating metal layer TFM. The semiconductor layer 151 has substantially a same planar pattern or shape as the data line 171, the source electrode 173, the floating metal layer TFM and the drain electrode 175 in the plan view, with the exception of the exposed portion of the projection 154. In other words, lateral walls or edges of the data line 171, the source electrode 173 and the drain electrode 175 in the plan view may be located at substantially the same positions as lateral walls or edges of the semiconductor layer 151 therebeneath. The edges of the data line 171, the source electrode 173, the drain electrode 175 and the semiconductor layer 151 may be substantially the same as each other because the data wire layer including the data line 171, the source electrode 173 and the drain electrode 175, and the semiconductor layer 151 and 154 are formed from a same material layer and/or by using the same mask and the same etchant in an exemplary embodiment of manufacturing the thin film array panel.

One gate electrode 124, one source electrode 173 and one drain electrode 175 form one thin film transistor TFT together with the projection 154 of the semiconductor layer 151, and the channel region of the thin film transistor is formed by or at the projection 154 of the semiconductor layer 151 between the source electrode 173 and drain electrode 175. In the illustrated exemplary embodiment, the floating metal layer TFM is disposed at a position corresponding to the channel region of the semiconductor layer 151.

A passivation layer is disposed on the data line 171, the source electrode 173, the floating metal layer TFM, the drain electrode 175 and the exposed portion of the projection 154 of the semiconductor layer 151.

The passivation layer may include a lower passivation layer 180a and an upper passivation layer 180b. The lower passivation layer 180a may include silicon oxide, silicon nitride, silicon oxynitride (SiON), an organic layer, or the like. The upper passivation layer 180b may include an organic layer. In an alternative exemplary embodiment, the upper passivation layer 180b may be omitted.

A pixel electrode 191 is disposed on the lower and upper passivation layers 180a and 180b. A contact hole 185 may be defined in the lower and upper passivation layers 180a and 180b. The pixel electrode 191 is physically and/or electrically connected to the drain electrode 175 through the contact hole 185, and receives a data voltage from the drain electrode 175.

Hereinafter, referring to FIGS. 3 to 5, an exemplary embodiment of a thin film transistor array panel and a method of manufacturing the same according to the invention will be described. The manufacturing method described herein may be applied in forming the exemplary embodiment of the thin film transistor array panel disclosed in FIGS. 1 and 2.

Figure 3:
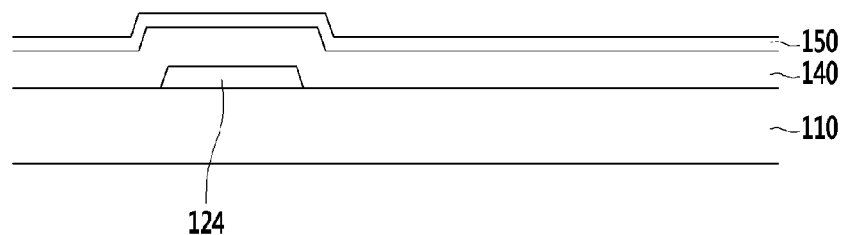
FIGS. 3 to 5 are cross-sectional views showing an exemplary embodiment of a method of manufacturing a thin film transistor array panel according to the invention.
Figure 4:
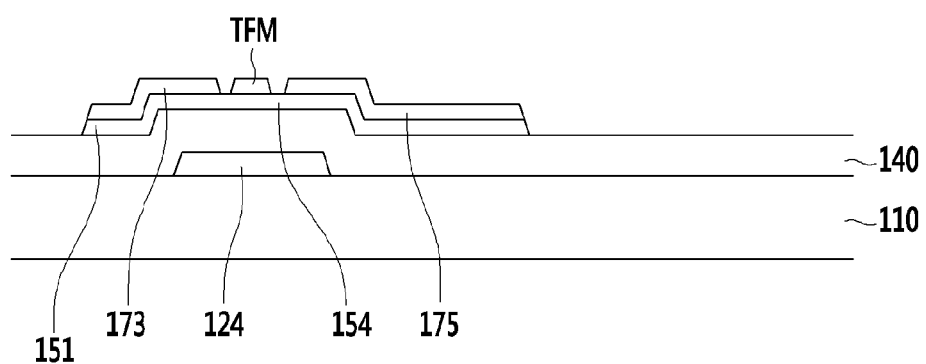
Figure 5:
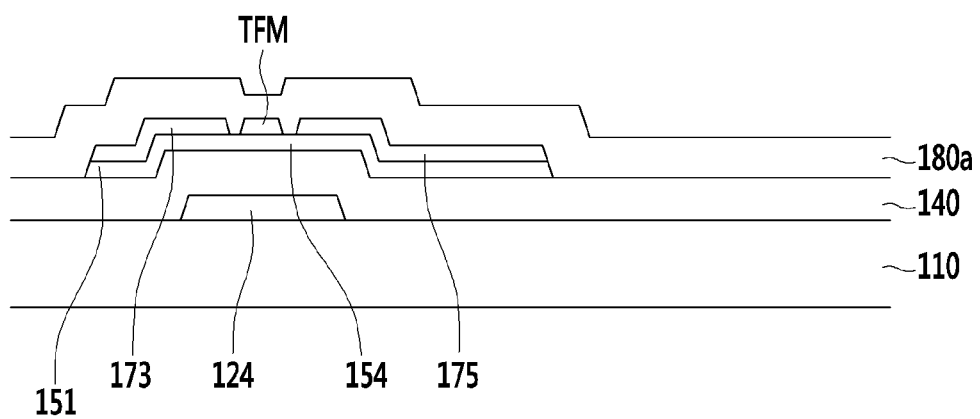

FIGS. 3 to 5 are cross-sectional views showing an exemplary embodiment of a method of manufacturing a thin film transistor array panel according to the invention.

Referring to FIG. 3, the gate electrode 124 is formed (e.g., provided) on the substrate 110 which includes transparent glass or plastics. The gate electrode 124 may be formed of aluminum-based metal such as aluminum (Al) and an aluminum alloy, silver-based metal such as silver (Ag) and a silver alloy, copper-based metal such as copper (Cu) and a copper alloy, molybdenum-based metal such as molybdenum (Mo) and a molybdenum alloy, chromium (Cr), titanium (Ti), tantalum (Ta), manganese (Mn), and the like. The gate electrode 124 as a single layer structure is disclosed herein, but the gate electrode 124 may have a double layer or triple layer structure, such as by a combination of layers having different physical properties.

The gate insulating layer 140 is formed on the substrate 110 to cover the gate electrode 124. The gate insulating layer 140 may be formed of silicon oxide, silicon nitride or silicon oxynitride (SiON) or the like, and may be formed by a sputtering method and the like. The gate insulating layer 140 as a single layer structure is disclosed herein, but the gate insulating layer 140 may have a double layer structure of silicon oxide and silicon oxynitride. In the double-layered structure, the silicon oxide layer may be a layer adjacent to the semiconductor layer 151 and 154 to be described below.

A semiconductor material layer 150 is formed on the gate insulating layer 140. The semiconductor material layer 150 may be formed of the oxide semiconductor. In the illustrated exemplary embodiment, the oxide semiconductor includes at least one selected from tantalum (Ta), zinc (Zn), indium (In), tin (Sn), gallium (Ga), and hafnium (Hf).

The semiconductor material layer 150 may be formed by using a chemical vapor deposition method, a sputtering method, a pulse laser deposition method, an atomic layer deposition method, a spin coating method, inkjet printing, a roll-to-roll method, a nanoimprinting method, and the like. In addition, the gate insulating layer 140 including silicon-based oxide or nitride may be formed by the chemical vapor deposition method, the sputtering method, and the atomic layer deposition method such as performing deposition in a plasma state.

In the exemplary embodiment according to the invention, the oxide semiconductor may have an amorphous structure or a crystalline structure.

Referring to FIG. 4, after a metal material layer is formed on the semiconductor material layer 151 and 154, the semiconductor layer 151 and 154, and the source electrode 173 and the drain electrode 175 facing each other with respect to the gate electrode 124 are formed through a patterning process. In the illustrated exemplary embodiment, the floating metal layer TFM may be formed between the source electrode 173 and the drain electrode 175 which are spaced apart from each other. Since the floating metal layer TFM is formed by patterning the metal material layer when the source electrode 173 and the drain electrode 175 are formed, the floating metal layer TFM may be formed of the same material as the source electrode 173 and the drain electrode 175. The floating metal layer TFM may be in and/or on a same layer of the thin film transistor array panel as the source electrode 173 and the drain electrode 175. When the metal material layer is patterned by forming the floating metal layer TFM overlapping a portion of the projection 154 of the semiconductor layer 151 at the channel region, damage the channel region of the thin film transistor may be reduced or effectively prevented to improve reliability of a device including the thin film transistor and the thin film transistor array panel.

The source electrode 173, the floating metal layer TFM and the drain electrode 175 may be formed of at least one selected from aluminum-based metal such as aluminum (Al) and an aluminum alloy, silver-based metal such as silver (Ag) and a silver alloy, copper-based metal such as copper (Cu) and a copper alloy, molybdenum-based metal such as molybdenum (Mo) and a molybdenum alloy, chromium (Cr), a chromium alloy, titanium (Ti), a titanium alloy, tantalum (Ta), a tantalum alloy, manganese (Mn), and a manganese alloy.

Referring to FIG. 5, the lower passivation layer 180a is formed on the gate insulating layer 140 to cover the source electrode 173, the floating metal layer TFM and the drain electrode 175. The lower passivation layer 180a may be formed of silicon oxide, silicon nitride, silicon oxynitride (SiON), or the like.

Thereafter, the upper passivation layer 180b is formed on the lower passivation layer 180a, the contact hole 185 is formed to extend through a thickness of the upper passivation layer 180b and the lower passivation layer 180a, and the pixel electrode 191 is formed. The pixel electrode 191 is connected to the drain electrode 175 through the contact hole 185. Referring again to FIG. 2, the thin film transistor array panel may be formed.

Figure 6:
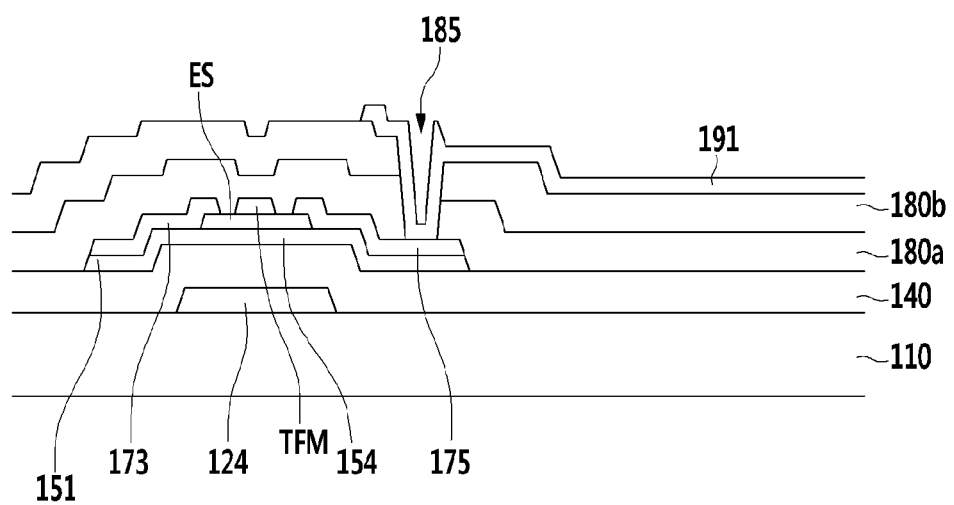
FIG. 6 is a cross-sectional view showing another exemplary embodiment of a thin film transistor array panel according to the invention.

FIG. 6 is a cross-sectional view showing another exemplary embodiment of a thin film transistor array panel according to the invention.

Referring to FIG. 6, a thin film transistor array panel includes substantially the same elements as those of the exemplary embodiment described in FIG. 2. However, an etching prevention layer ES is positioned between the projection 154 of the semiconductor layer 151 and an end of the source electrode 173, between the projection 154 of the semiconductor layer 151 and the floating metal layer TFM, and between the projection 154 of the semiconductor layer 151 and an end of the drain electrode 175.

The etching prevention layer ES may include silicon-based oxide or nitride. The etching prevention layer ES may reduce or effectively prevent silicon oxide ($SiO_2$) or distilled water that may occur in a subsequent manufacturing process from being transmitted to the channel region of the thin film transistor at the projection 154 of the semiconductor layer 151. The etching prevention layer ES is disposed to correspond to the channel region of the projection 154 of the semiconductor layer 151.

Referring to FIG. 6 again, the end of the source electrode 173 and the end of the drain electrode 175 are positioned to overlap the outer edge of the etching prevention layer ES. The etching prevention layer ES is partially exposed where the source electrode 173 and the drain electrode 175 are spaced apart from each other. The floating metal layer TFM is disposed on the exposed portion of the etching preventing layer ES.

The structure of the illustrated exemplary embodiment may be used as a double gate structure. The double gate structure is different from a mechanism of the illustrated exemplary embodiment in that an electrical current flow is formed in a back channel and a front channel by applying the same voltage to a top gate and a bottom gate, respectively. The structure of the illustrated exemplary embodiment of the thin film transistor according to the invention may increase the electrical current in a state where the voltage is not separately applied and improve reliability unlike the double gate structure.

Hereinafter, referring to FIGS. 7 to 11, another exemplary embodiment of a method of manufacturing a thin film transistor array panel according to the invention will be described. The manufacturing method described herein may be applied in forming the thin film transistor array panel disclosed in FIG. 6.

FIGS. 7 to 11 are cross-sectional views showing an exemplary embodiment of a method of manufacturing a thin film transistor array panel according to the invention.

Figure 7:
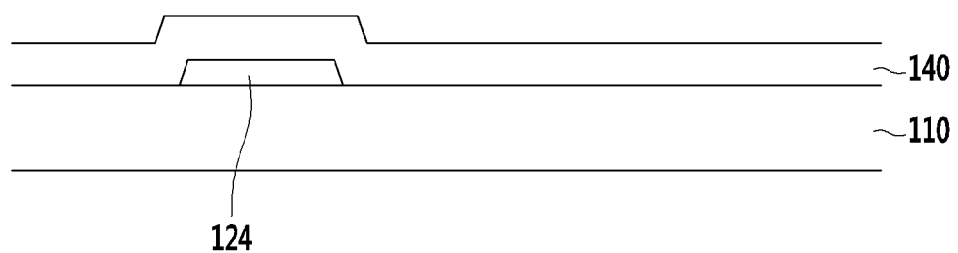
FIGS. 7 to 11 are cross-sectional views showing another exemplary embodiment of a method of manufacturing a thin film transistor array panel according to the invention.

Referring to FIG. 7, the gate electrode 124 is formed (e.g., provided) on the substrate 110 which includes transparent glass or plastics. The gate electrode 124 may be formed of an aluminum-based metal such as aluminum (Al) and an aluminum alloy, a silver-based metal such as silver (Ag) and a silver alloy, a copper-based metal such as copper (Cu) and a copper alloy, molybdenum-based metal such as molybdenum (Mo) and a molybdenum alloy, chromium (Cr), titanium (Ti), tantalum (Ta), manganese (Mn), and the like. The gate electrode 124 as a single layer structure is disclosed herein, but the gate electrode 124 may have a double layer or triple layer structure, such as by a combination of layers having different physical properties.

The gate insulating layer 140 is formed on the substrate 110 to cover the gate electrode 124. The gate insulating layer 140 may be formed of silicon oxide, silicon nitride, silicon oxynitride (SiON) or the like, and may be formed by a sputtering method and the like. The gate insulating layer 140 as a single layer structure is described herein, but the gate insulating layer 140 may have a double layer structure of silicon oxide and silicon oxynitride. In the double-layered structure, the silicon oxide layer may be a layer adjacent to the semiconductor layer 151 and 154 to be described below.

Figure 8:
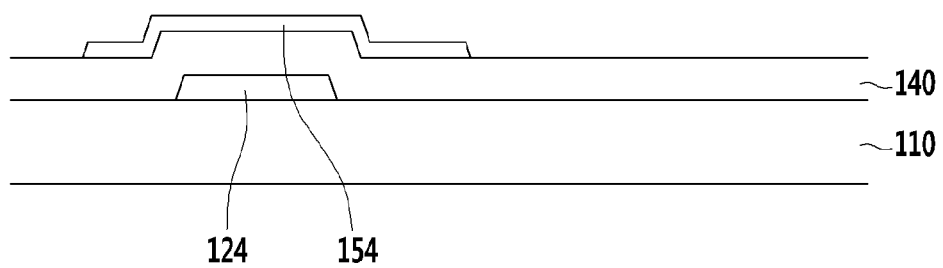

Referring to FIG. 8, a semiconductor material layer is formed on the gate insulating layer 140, and then patterned to form the semiconductor layer 154. The semiconductor layer 154 may be formed of the oxide semiconductor. In the illustrated exemplary embodiment, the oxide semiconductor includes at least one selected from of tantalum (Ta), zinc (Zn), indium (In), tin (Sn), gallium (Ga), and hafnium (Hf).

The semiconductor material layer may be formed by using a chemical vapor deposition method, a sputtering method, a pulse laser deposition method, an atomic layer deposition method, a spin coating method, inkjet printing, a roll-to-roll method, a nanoimprinting method, and the like. In addition, the gate insulating layer 140 including silicon-based oxide or nitride may be formed by the chemical vapor deposition method, the sputtering method, and the atomic layer deposition method such as performing deposition in a plasma state. The semiconductor material layer 151 and 154 are formed through a patterning process.

In the exemplary embodiment according to the invention, the oxide semiconductor may have an amorphous structure or a crystalline structure.

Figure 9:
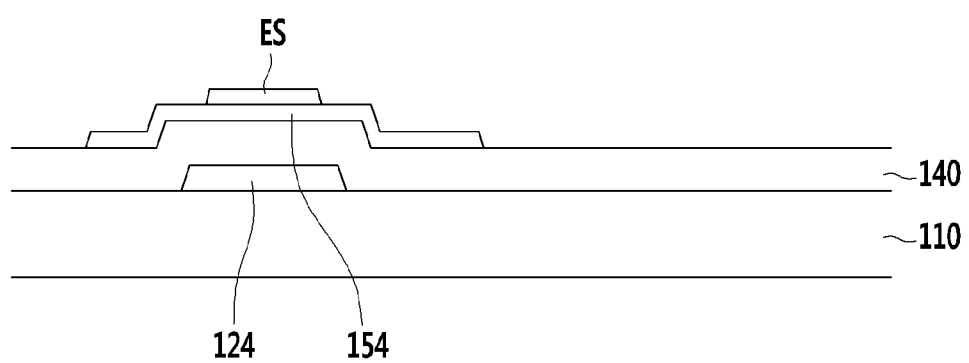

Referring to FIG. 9, the etching prevention layer ES is formed at a position corresponding to the channel region of the thin film transistor at the projection 154 of the semiconductor layer 151. The etching prevention layer ES may be formed of silicon-based oxide or nitride. The etching prevention layer ES may serve to reduce or effectively prevent silicon oxide ($SiO_2$) or distilled water that may occur in a subsequent manufacturing process from being transmitted to the channel portion of the thin film transistor at the projection 154 of the semiconductor layer 151.

Figure 10:
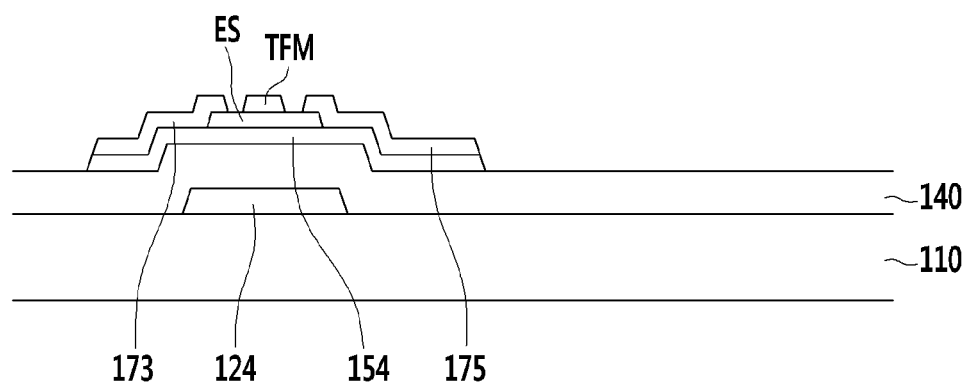

Referring to FIG. 10, ends of the source electrode 173 and the drain electrode 175 are formed to overlap the edge of the etching prevention layer ES, and the floating metal layer TFM is formed at a position corresponding to a substantially central portion of the exposed etching prevention layer ES. The source electrode 173 and the drain electrode 175 face each other with respect to the gate electrode 124 substantially centered therebetween. The etching prevention layer ES is partially exposed at a position at which the source electrode 173 and the drain electrode 175 are spaced apart from each other. The floating metal layer TFM is formed on the exposed portion of the etching prevention layer ES.

The data wire layer including the data line 171, the floating metal layer TFM, the source electrode 173, and the drain electrode 175 may be formed of at least one selected from aluminum-based metal such as aluminum (Al) and an aluminum alloy, silver-based metal such as silver (Ag) and a silver alloy, copper-based metal such as copper (Cu) and a copper alloy, molybdenum-based metal such as molybdenum (Mo) and a molybdenum alloy, chromium (Cr), a chromium alloy, titanium (Ti), a titanium alloy, tantalum (Ta), a tantalum alloy, manganese (Mn), and a manganese alloy.

The illustrated exemplary embodiment discloses that the data line 171, the source electrode 173 and the drain electrode 175 are formed as a single layer, but the invention is not limited thereto. In an alternative exemplary embodiment, the data line 171, the source electrode 173 and the drain electrode 175 may be formed as a dual layer or triple layer structure.

Figure 11:
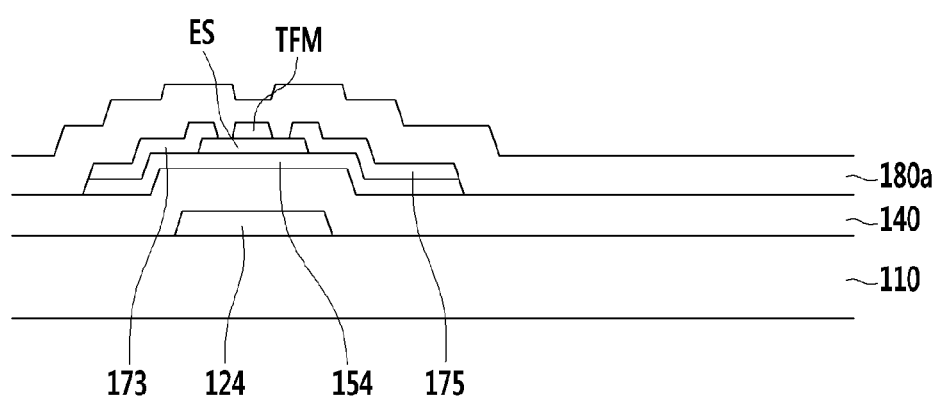

Referring to FIG. 11, the lower passivation layer 180a is formed on the gate insulating layer 140 to cover the source electrode 173, the floating metal layer TFM and the drain electrode 175. The lower passivation layer 180a may be formed of silicon oxide, silicon nitride, silicon oxynitride (SiON), or the like.

Thereafter, the upper passivation layer 180b is formed on the lower passivation layer 180a, the contact hole 185 is formed to extend through a thickness of the upper passivation layer 180b and the lower passivation layer 180a, and the pixel electrode 191 is formed. The pixel electrode 191 is connected to the drain electrode 175 through the contact hole 185. Referring again to FIG. 6, the thin film transistor array panel may be formed.

Hereinafter, in an exemplary embodiment of a thin film transistor array panel according to the invention, the floating metal layer will be described in detail with reference to FIGS. 12 and 13.

Figure 12:
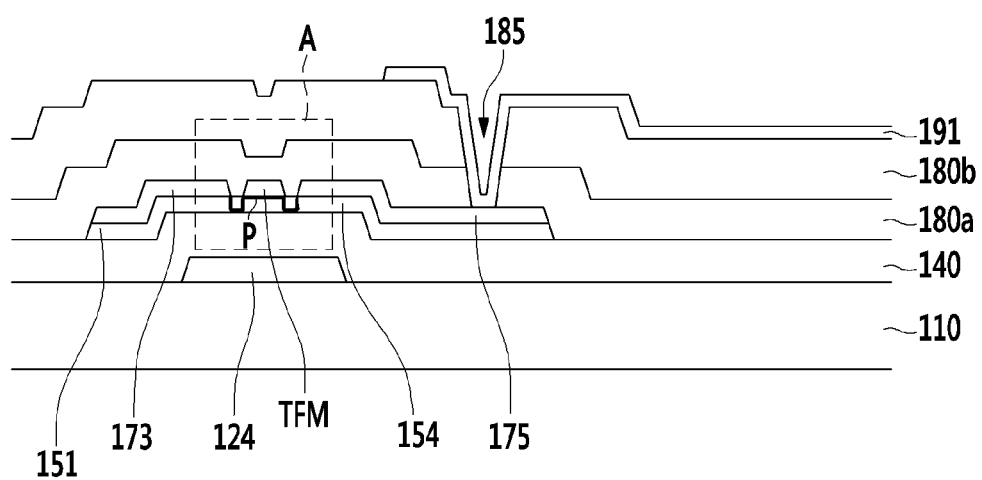
FIG. 12 is a cross-sectional view showing an exemplary embodiment of a current flow in a thin film transistor according to the invention.

FIG. 12 is a cross-sectional view showing an exemplary embodiment of a current flow in a thin film transistor including a floating metal layer according to the invention. FIG. 13 is an enlarged view of region A of FIG. 12.

Figure 13:
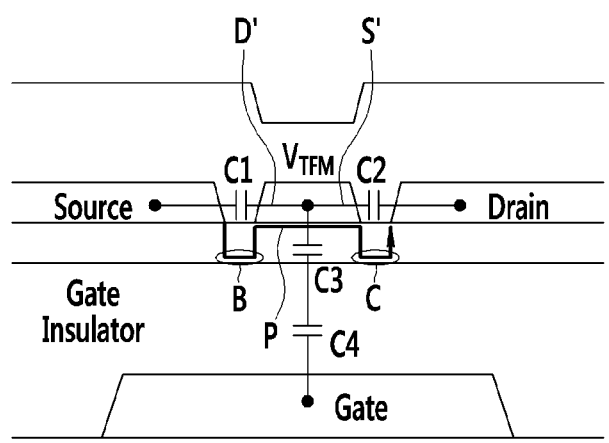
FIG. 13 is an enlarged view of region A of FIG. 12.

Referring to FIGS. 12 and 13, in the illustrated exemplary embodiment, the floating metal layer TFM is electrically isolated and electrically floated with respect to other elements of the thin film transistor in design, but a voltage is applied by a coupling effect of capacitance components C1, C2, C3 and C4 formed according to a condition of the voltage applied to the gate electrode 124 and the drain electrode 175. An imaginary source portion S' and an imaginary drain portion D' substantially acting as a source electrode and a drain electrode are formed on the floating metal layer TFM by the voltage applied to the gate electrode 124 and the drain electrode 175, which allows electrical current to flow in a path similar to a W-path.

Where portions of the floating metal layer TFM act as a source electrode and a drain electrode, as shown in FIG. 13, the electrical current flowing through the thin film transistor flows along a first path P in a "W" shape from the source electrode SOURCE, to the floating metal layer TFM and further to the drain electrode DRAIN. Since the electrical current follows the W-shaped path P, an effective channel length may be reduced to increase an "on" current of the thin film transistor.

Further, as a width of the floating metal layer TFM is increased in the channel region, the effective channel length may be further reduced. As the voltage $V_{TFM}$ applied to the floating metal layer TFM is increased due to an increased capacitance C1 and capacitance C2, the "on" current of the thin film transistor may be increased. Herein, the width of the floating metal layer TFM may be defined as a length of the floating metal layer TFM in a direction that is parallel to an imaginary line extended through the source electrode 173 and the drain electrode 175 shown in FIG. 13.

In addition, in the structure of the exemplary embodiment of the thin film transistor according to the invention, since the flow path of the electrical current is not the entire channel region but is the first path P, a section in which electrons can be trapped is only sections represented by a first region B and a second region C in FIG. 13, accordingly, stability of the thin film transistor and the device including the thin film transistor is excellent. Further, since the section in which the electrons can be trapped is reduced as the width of the floating metal layer TFM is increased, stability of the thin film transistor and the device including the thin film transistor may be further improved.

The width of the floating metal layer TFM may be defined based on a minimum distance in an extension direction of the line crossing the floating metal layer TFM, through which the source electrode 173 and the drain electrode 175. In consideration of a process margin in manufacturing the thin film array panel, the width of the floating metal layer TFM may be from about 1.5 micrometers (um) to about 2.0 um, or more than about 1.5 um to about 2.0 um. Where the width of the floating metal layer TFM is less than about 1.5 um, patterning the floating metal layer TFM may be difficult.

The straight-line distance between the source electrode 173 and the floating metal layer TFM and the straight-line distance between the drain electrode 175 and the floating metal layer TFM may be from about 1.5 um to about 2.0 um, or more than about 1.5 um to about 2.0 um in consideration of the process margin. The effective channel length may be a value obtained by adding the straight-line distance between the source electrode 173 and the floating metal layer TFM, the width of the floating metal layer TFM, and the straight-line distance between the drain electrode 175 and the floating metal layer TFM. In exemplary embodiments, the width of the floating metal layer TFM be maximized within a permissible range of the process margin with respect to a range of the effective channel length.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor array panel, comprising:
    a substrate,
    a thin film transistor on the substrate, the thin film transistor comprising:
        a gate electrode which receives a gate signal,
        a gate insulating layer on the gate electrode,
        a semiconductor layer on the gate insulating layer,
        a source electrode and a drain electrode which receives a data voltage, on the semiconductor layer and facing each other, and
        a floating metal layer disposed between the drain electrode and the source electrode, the floating metal layer electrically floating,
    a pixel electrode connected to the drain electrode of the thin film transistor through a contact hole, the pixel electrode which receives the data voltage from the drain electrode to which it is connected, and
    a passivation layer covering the thin film transistor to which the pixel electrode is connected.

2. The thin film transistor array panel of claim 1, wherein: the semiconductor layer comprises a channel portion, and the floating metal layer overlaps the channel portion of the semiconductor layer.

3. The thin film transistor array panel of claim 2, wherein: the floating metal layer is directly on the semiconductor layer.

4. The thin film transistor array panel of claim 3, wherein: the floating metal layer is in a same layer as the source electrode and the drain electrode.

5. The thin film transistor array panel of claim 4, wherein: the floating metal layer is island-shaped.

6. The thin film transistor array panel of claim 5, wherein: an electrical current moving path in the semiconductor layer has a "W" shape.

7. The thin film transistor array panel of claim 2, wherein the thin film transistor further comprises:
a single, unitary etching prevention layer between the floating metal layer and the semiconductor layer, elongated between the source and drain electrodes of the thin film transistor,
wherein
the single, unitary etching prevention layer covers a channel region of the semiconductor layer, and
an upper surface of the etching prevention layer contacts the passivation layer between the source electrode and the floating metal layer or between the drain electrode and the floating metal layer.

8. The thin film transistor array panel of claim 7, wherein:
the source electrode and the drain electrode overlap opposing edges of the elongated single, unitary etching prevention layer which is between the floating metal layer and the semiconductor layer.

9. The thin film transistor array panel of claim 8, wherein:
the floating metal layer is in a same layer as the source electrode and the drain electrode.

10. The thin film transistor array panel of claim 9, wherein:
the floating metal layer is island-shaped.

11. The thin film transistor array panel of claim 10, wherein:
an electrical current moving path in the semiconductor layer has a "W" shape.

12. The thin film transistor array panel of claim 1, wherein:
the semiconductor layer comprises an oxide semiconductor.

13. The thin film transistor array panel of claim 12, wherein:
the floating metal layer comprises a material having a Fermi level higher than a Fermi level of the semiconductor layer.

14. A method of manufacturing a thin film transistor array panel, the method comprising:
providing a thin film transistor, the thin film transistor comprising:
a gate electrode which receives a gate signal from a gate line, on a substrate,
a gate insulating layer on the gate electrode,
an oxide semiconductor layer on the gate insulating layer,
a source electrode and a drain electrode which is extended from a data line which transmits a data voltage, facing each other on the oxide semiconductor layer, and
a floating metal layer between the source electrode and the drain electrode, the floating metal layer electrically floating,
providing a pixel electrode connected to the drain electrode of the thin film transistor through a contact hole, the pixel electrode receiving the data voltage from the drain electrode to which it is connected, and
providing a passivation layer covering the thin film transistor to which the pixel electrode is connected.

15. The method of manufacturing a thin film transistor array panel of claim 14, wherein:
the oxide semiconductor layer comprises a channel portion, and
the floating metal layer overlaps the channel portion of the oxide semiconductor layer.

16. The method of manufacturing a thin film transistor array panel of claim 15, wherein:
the floating metal layer is directly on the oxide semiconductor layer.

17. The method of manufacturing a thin film transistor array panel of claim 16, wherein:
the providing the source electrode, the drain electrode and the floating metal layer comprises forming the floating metal layer during a same process as forming the source electrode and the drain electrode.

18. The method of manufacturing a thin film transistor array panel of claim 15, wherein the thin film transistor further comprises:
a single, unitary etching prevention layer between the floating metal layer and the oxide semiconductor layer, elongated between the source and drain electrodes of the thin film transistor, the elongated single, unitary etching prevention layer exposed between the source electrode and the drain electrode, and the floating metal layer, respectively.

19. The method of manufacturing a thin film transistor array panel of claim 18, wherein:
the source electrode and the drain electrode overlap opposing edges of the elongated single, unitary etching prevention layer which is between the floating metal layer and the semiconductor layer.

20. The thin film transistor array panel of claim 1, wherein:
portions of the electrically floating metal layer disposed between the drain electrode and the source electrode respectively define:
a drain portion of the thin film transistor through which electrical current flows from the source electrode to the drain portion, and
a source portion of the thin film transistor through which electrical current flows from the source portion to the drain electrode.

* * * * *